United States Patent
Okuyama

(10) Patent No.: US 7,924,407 B2
(45) Date of Patent: Apr. 12, 2011

(54) EXPOSURE DEVICE

(75) Inventor: Takashi Okuyama, Machida (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 409 days.

(21) Appl. No.: 12/135,375

(22) Filed: Jun. 9, 2008

(65) Prior Publication Data

US 2009/0001292 A1    Jan. 1, 2009

(30) Foreign Application Priority Data

Jun. 29, 2007 (JP) ................. 2007-171880

(51) Int. Cl.
  G03B 27/54 (2006.01)
  G03B 27/42 (2006.01)
  G02B 26/00 (2006.01)
  G02B 26/12 (2006.01)
(52) U.S. Cl. .......... 355/67; 355/53; 359/225.1; 359/291
(58) Field of Classification Search .............. 355/53, 355/67; 359/197, 198, 223, 224, 225, 290, 359/291, 292, 298, 315, 316, 224.1, 225.1
See application file for complete search history.

(56) References Cited

U.S. PATENT DOCUMENTS

| | | | | |
|---|---|---|---|---|
| 5,933,183 A | * | 8/1999 | Enomoto et al. | 347/241 |
| 6,046,840 A | * | 4/2000 | Huibers | 359/291 |
| 6,312,134 B1 | * | 11/2001 | Jain et al. | 359/855 |
| 2007/0291348 A1 | * | 12/2007 | Ejiri et al. | 359/298 |

FOREIGN PATENT DOCUMENTS

| | | |
|---|---|---|
| JP | 2006-113413 | 4/2006 |
| JP | 2006-343684 | 12/2006 |

OTHER PUBLICATIONS

English Translation of JP 2006-343684 (dated Dec. 21, 2006).*

* cited by examiner

*Primary Examiner* — Alan A Mathews
(74) *Attorney, Agent, or Firm* — Berenato & White, LLC

(57) ABSTRACT

The present invention relates to an exposure device for forming circuit patterns onto a surface of an object. The exposure device includes at least one spatial light modulator which includes a plurality of reflection elements being arranged in a matrix fashion, at least one optical source which supplies exposure light to the reflection elements, and a bias voltage controller which applies a first voltage to the reflection elements, thereby setting the reflection elements to a first state and which does not apply a voltage to the reflection elements, thereby setting the reflection elements to a second state. In addition, the exposure light is delivered to the surface of the object in the first state, and the exposure light is not delivered to the surface of the object in the second state.

9 Claims, 7 Drawing Sheets

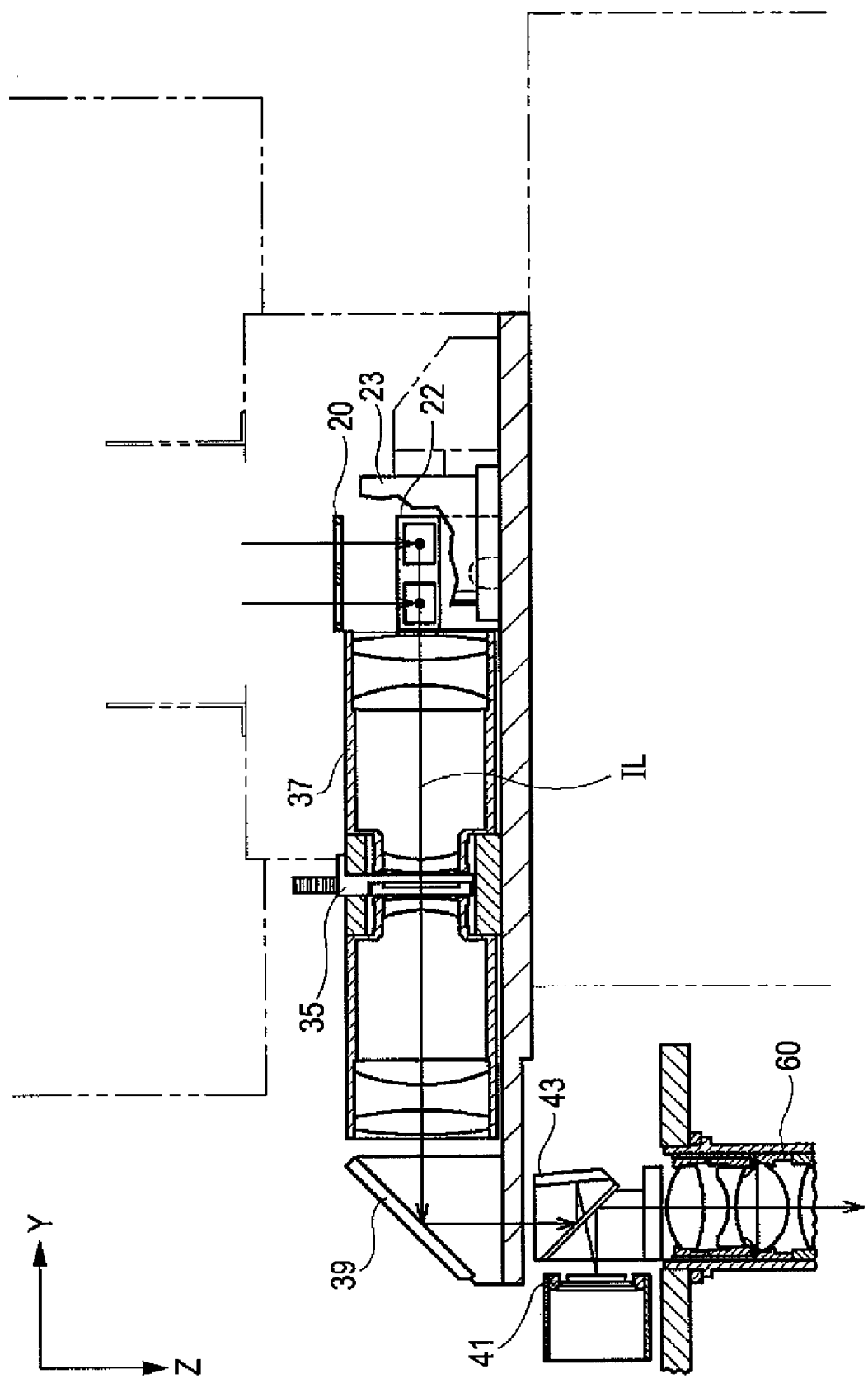

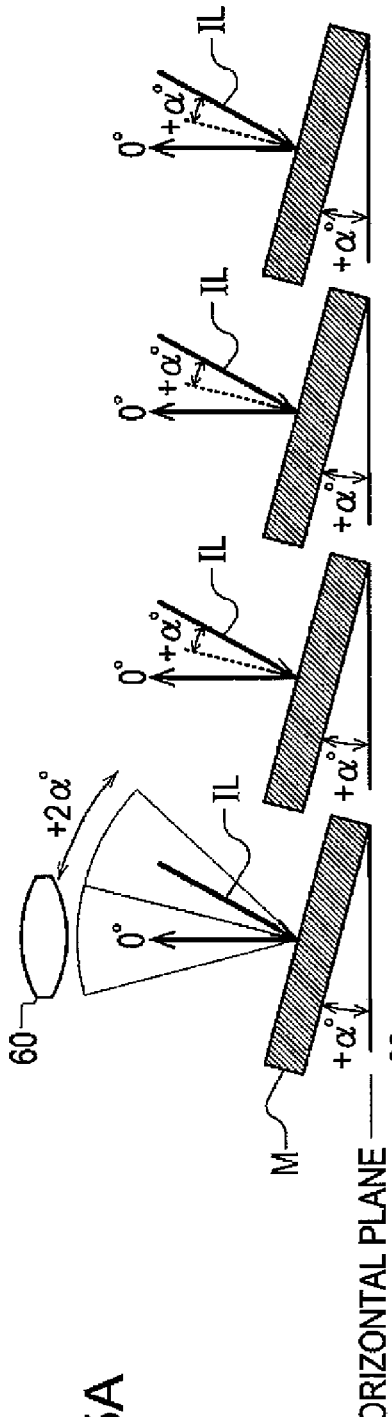
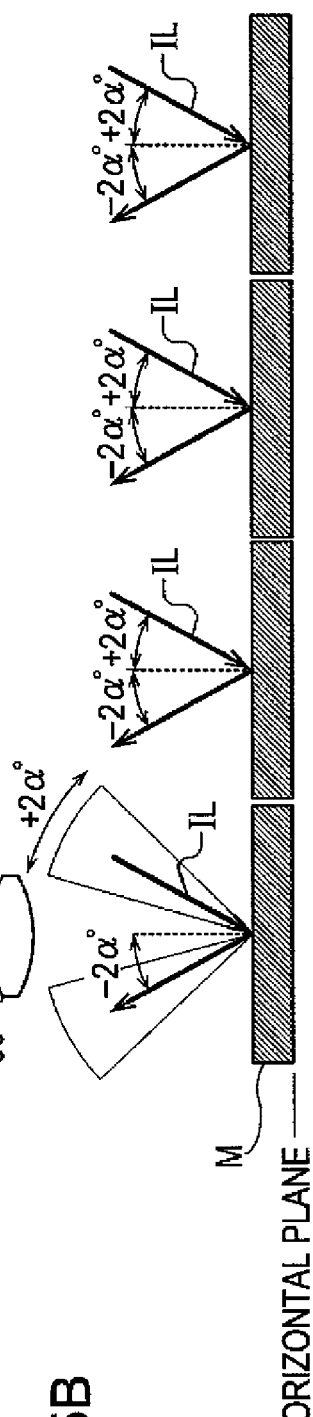
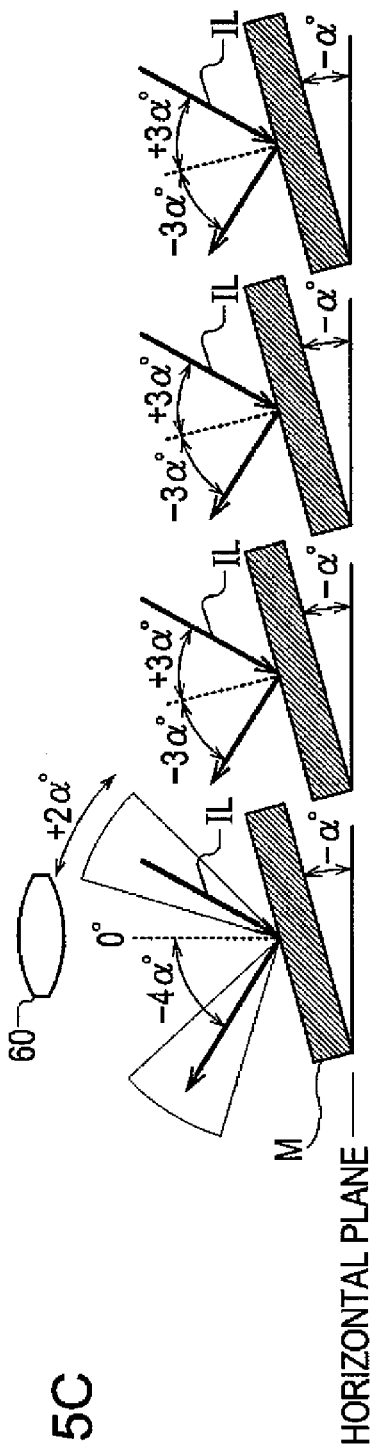
FIG. 5A
FIG. 5B
FIG. 5C

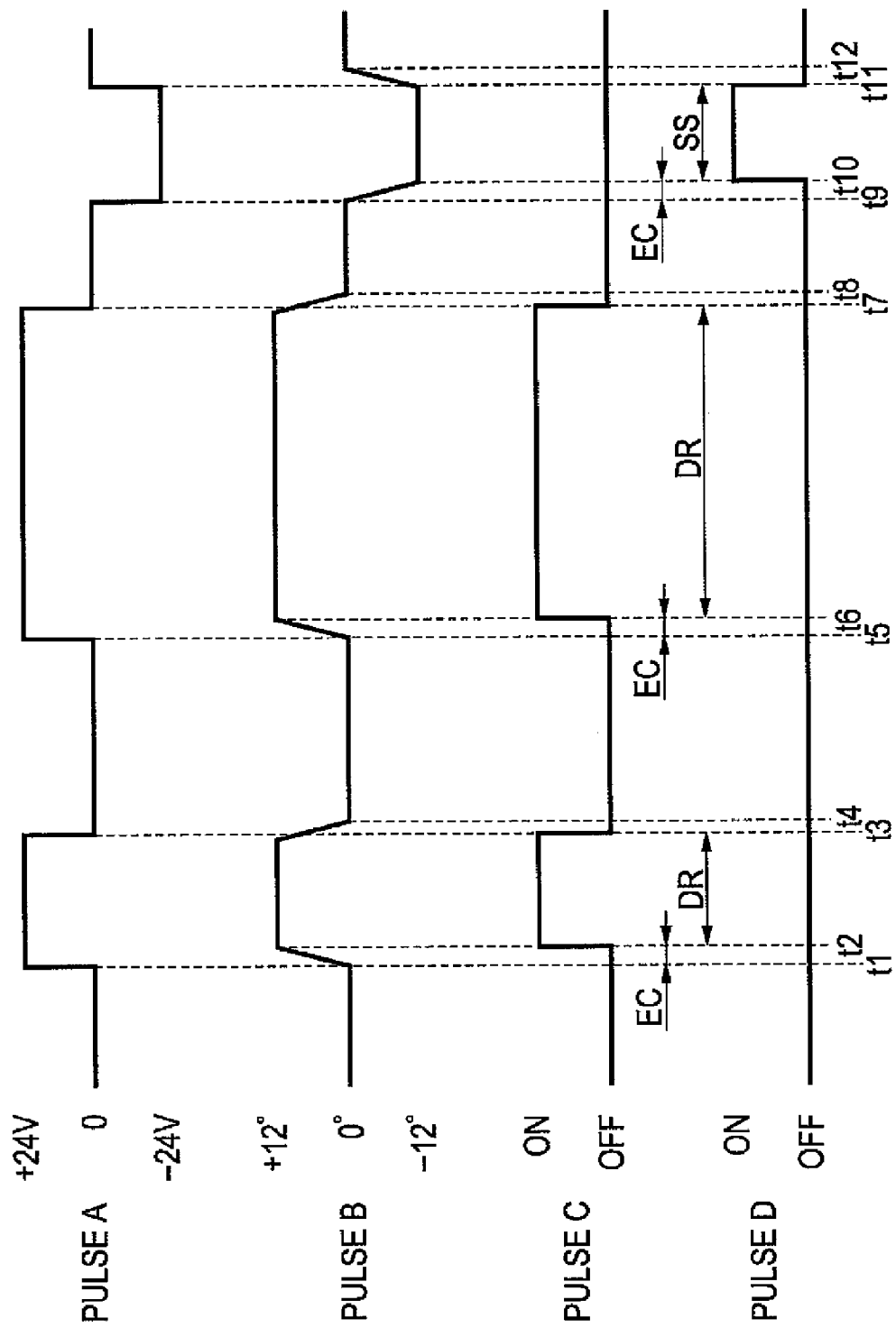

# EXPOSURE DEVICE

CROSS-REFERENCE TO RELATED APPLICATIONS

This application claims the benefit of Japanese Patent Application 2007-171880 filed on Jun. 29, 2007, the disclosure of which is incorporated herein by reference.

BACKGROUND OF THE INVENTION

1. Field of the Invention

The present invention relates to an exposure device for forming patterns on a surface of a flat-sheet material, including a substrate for an electronic circuit, a glass substrate for an LCD and a glass element substrate for a PDP.

2. Description of the Related Art

Exposure devices for forming circuit patterns onto a plane substrate used to be classified into contact and non-contact types. Contact type exposure devices bring a transfer mask into contact with a substrate (or an object), and non-contact type devices do not put them in contact. However, different type exposure devices, which form circuit patterns onto a substrate without using a transfer mask by directly irradiating exposure light on the substrate, have been introduced (see Japanese Unexamined Patent Application Publications 2006-113413 and 2006-343684). Devices of this maskless type are increasingly in demand due to their excellent maintenance properties.

Such a maskless type exposure device is configured to receive exposure data on transfer patterns and to control exposure light by using spatial light modulators (or digital micromirror devices (DMDs)), based on the received data, so that it achieves the maskless operation.

The exposure device of JP A 2006-113413 or JP A 2006-343684 uses a shutter device and DMDs and operates them in sync with each other, thereby controlling exposure light necessary for forming patterns. In this device, each DMD is constituted of multiple micro-mirrors, and their orientations are changed whereby the exposure light is controlled. However, changing the orientations involves a considerable time. Accordingly, the exposure device needs to halt the exposure operation while the orientations of the micro-mirrors are in the course of changing, for example, after an object is fed. Thus, this period is prone to hinder the enhancement of the exposure speed. In other words, it can be the production bottleneck.

In order to improve the production capacity, various approaches to control exposure light efficiently have been employed. One of them is to use a photosensitive material having an improved sensitivity to g, h and i lines and a UV lamp for emitting light of those wavelengths. Consequently, the reaction speed of photosensitive material is increased. However, no matter how fast the reaction speed is, the time period required to change the orientations of the micro-mirrors is still critical in improving the efficiency of the exposure operation.

Taking the above disadvantage into account, the present invention has been conceived. An object of the present invention is to provide an exposure device which can conduct an exposure process efficiently. An additional object of the present invention is to present an exposure device which achieves a short spatial light modulation time.

SUMMARY OF THE INVENTION

According to a first aspect of the present invention, there is provided, an exposure device for forming circuit patterns onto a surface of an object, comprising:

a1) at least one spatial light modulator which includes a plurality of reflection elements being arranged in a matrix fashion;

a2) at least one optical source which supplies exposure light to the reflection elements; and a3) a bias voltage controller which applies a first voltage to the reflection elements, thereby setting the reflection elements to a first state and which does not apply a voltage to the reflection elements, thereby setting the reflection elements to a second state. Furthermore, the exposure light is delivered to the surface of the object in the first state, and the exposure light is not delivered thereto in the second state.

In the above structure, the bias voltage controller applies the first voltage to the reflection elements, whereby the reflection elements are set to the first state. Following this, the circuit patterns are formed on the object. Meanwhile, when the bias voltage controller does not apply the bias voltage to the reflection elements, that is, when the bias voltage is blocked off, the reflection elements are set to the second state. As a result, the circuit patterns are not formed on the object. The reflection elements of the spatial light modulator are switched between the first and second states, depending on the presence or absence of the first bias voltage. Thus, the transition duration is about half as long as conventional ones.

According to a second aspect of the present invention, there is provided, the exposure device according to the first aspect in which if the reflection elements in the first state form an angle of $\alpha°$ with those in the second state, then the exposure light that is incident on and reflected from the reflection elements has a luminous flux angle of $2\alpha°$ or less. If the luminous flux angle of the exposure light which is incident on the reflection elements is considerably wide, then the part of the exposure light may be irradiated to the surface of the object even in the second state. By setting the luminous flux angle to $2\alpha°$ or less on the condition that the reflection elements in the first state form an angle of $\alpha°$ with those in the second state, the whole exposure light is not irradiated to the surface of the object.

According to a third aspect of the present invention, there is provided, the exposure device according to the first or second aspect, in which the bias voltage controller further applies a third voltage to the reflection elements, thereby setting the reflection elements to a third state, and in which the exposure light is not delivered to the surface of the object in the third state, and the third state is different from the second state.

This structure attains the third state where the exposure light is not delivered to the surface of the object and which is different from the second state in the route of the exposure light reflected from the reflection elements.

According to a fourth aspect of the present invention, there is provided, the exposure device according to the third aspect, further comprising a control section for monitoring an intensity of the exposure light in the second or third state.

Because there are two different states where the exposure light is not delivered to the surface of the object, the intensity of the exposure light can be monitored by the control section in one of the second and third states.

According to a fifth aspect of the present invention, there is provided, the exposure device according to the third aspect, further comprising a control section for monitoring an operation of the spatial light modulator in the second or third state.

Because there are two different states where the exposure light is not delivered to the surface of the object, the operation of the spatial light modulator can be monitored by the control section in one of the second and third states.

According to a sixth aspect of the present invention, there is provided, the exposure device according to the first or second aspect, in which the optical source comprises a super high pressure mercury lamp, a xenon lamp, a flash lamp and an LED.

Any of a super high pressure mercury lamp, a xenon lamp, a flash lamp and an LED can function as a high-intensity optical a source. Accordingly, when the transition duration between the first and second states is cut in half, those high-intensity lamps are practical to shorten the exposure time.

In conclusion, with the exposure device of the present invention, the time period during which the spatial light modulator modulates the exposure light can be half as long as that of conventional devices. Thus, this exposure device satisfies a need for the short light modulation time and, hence shortens the exposure operation time greatly.

Other aspects, features and advantages of the present invention will become apparent upon reading the following specification and claims when taken in conjunction with the accompanying drawings.

BRIEF DESCRIPTION OF THE DRAWINGS

For more complete understanding of the present invention and the advantages hereof, reference is now made to the following description taken in conjunction with the accompanying drawings wherein:

FIG. 3 is a vertical longitudinal sectional view depicting a second lighting system 37 of the exposure device 100;

FIG. 5 is a view depicting a relationship between angles of the micro-mirror M and of incident light;

FIG. 6 is a timing chart of forming circuit patterns; and

DETAILED DESCRIPTION OF THE EXEMPLARY EMBODIMENTS OF THE INVENTION

Whole Structure of Exposure Device

Figure 1:
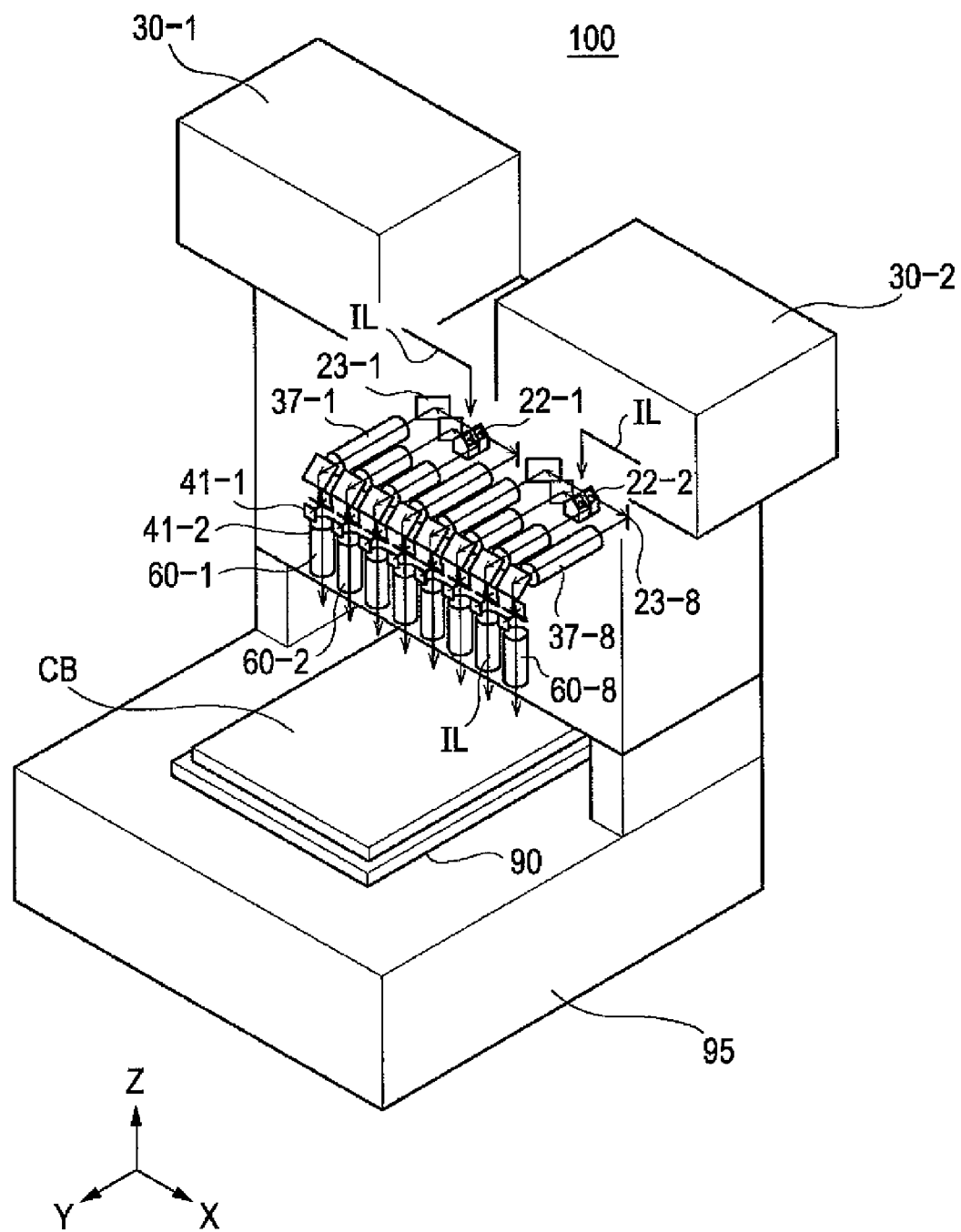
FIG. 1 is a schematically perspective view depicting an exposure device 100 according to an embodiment of the present invention.

FIG. 1 schematically shows an exposure device 100 according to an embodiment of the present invention. This exposure device 100 mainly includes first lighting systems 30-1 and 30-2, second lighting systems 37-1 to 37-8, spatial light modulators (thereinafter referred to as "DMDs") 41-1 to 41-8, projection optical systems 60-1 to 60-8, and an object table 90. The reason why the two first lighting systems (30-1 and 30-2) are used is to irradiate an object CB widely. However, if the object CB is relatively small, then only one of the first lighting systems may be used.

Figure 2:
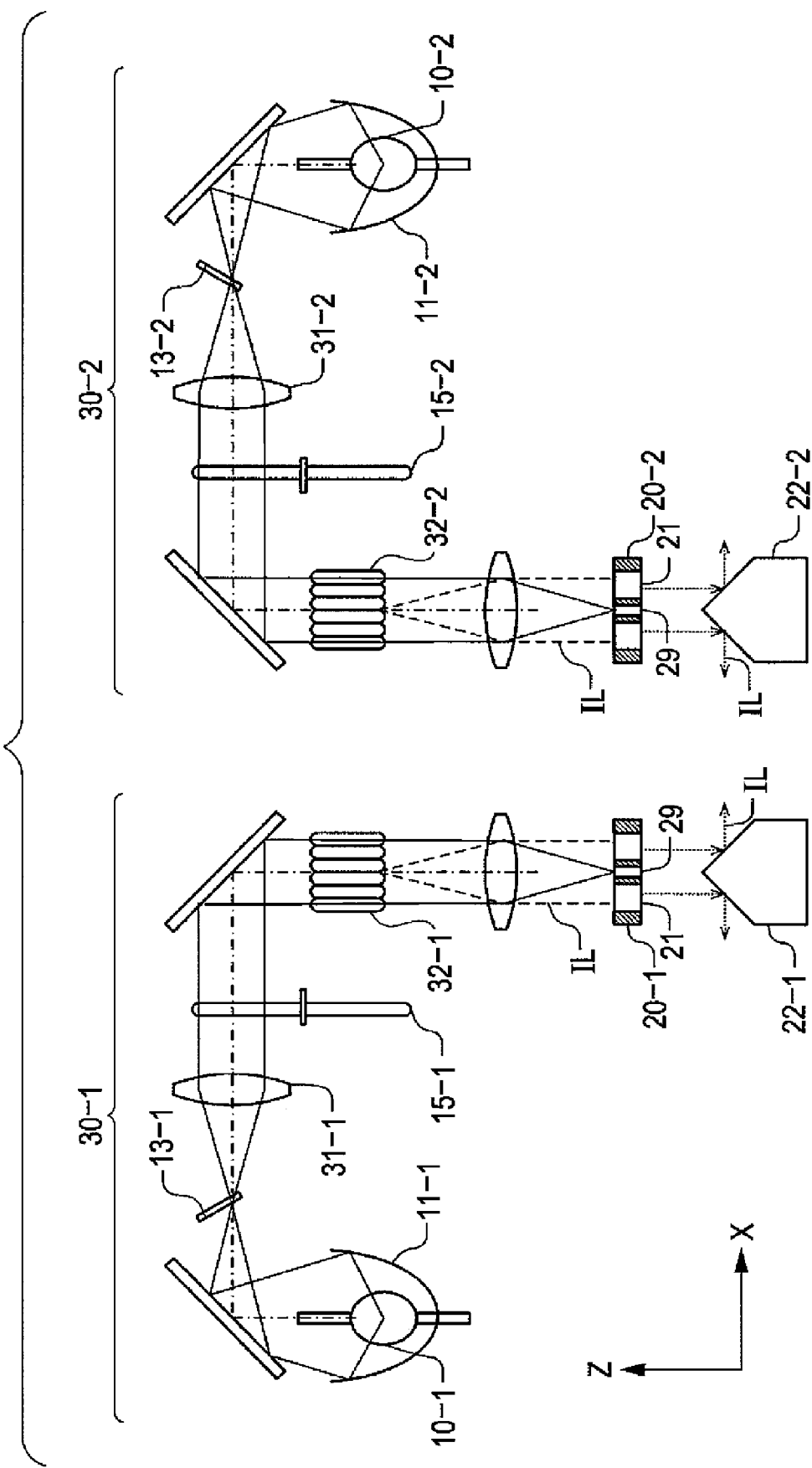
FIG. 2 is schematic view depicting first lighting systems 30-1 and 30-2.

FIG. 2 schematically shows the first lighting systems 30-1 and 30-2. Since both lighting systems have the identical structure, only the first lighting system 30-1 will be described below.

Referring to this drawing, the first lighting system 30-1 is equipped with a super high-pressure mercury lamp 10-1. This lamp is located at a primary focal point of an elliptic mirror 11-1. The elliptic mirror 11-1 reflects efficiently the UV light emitted from the super high-pressure mercury lamp 10-1 toward a secondary focal point of the elliptic mirror 11-1. Although the super high-pressure mercury lamp 10-1 is used for an optical source of this embodiment, the optical source is not limited to it in this invention. Alternatively, a xenon lamp, flash lamp or light emitting diode (LED) may be utilized. Moreover, it is preferable that the super high-pressure mercury lamp 10-1 is of a high output type in terms of the exposure efficiency.

Figure 7:
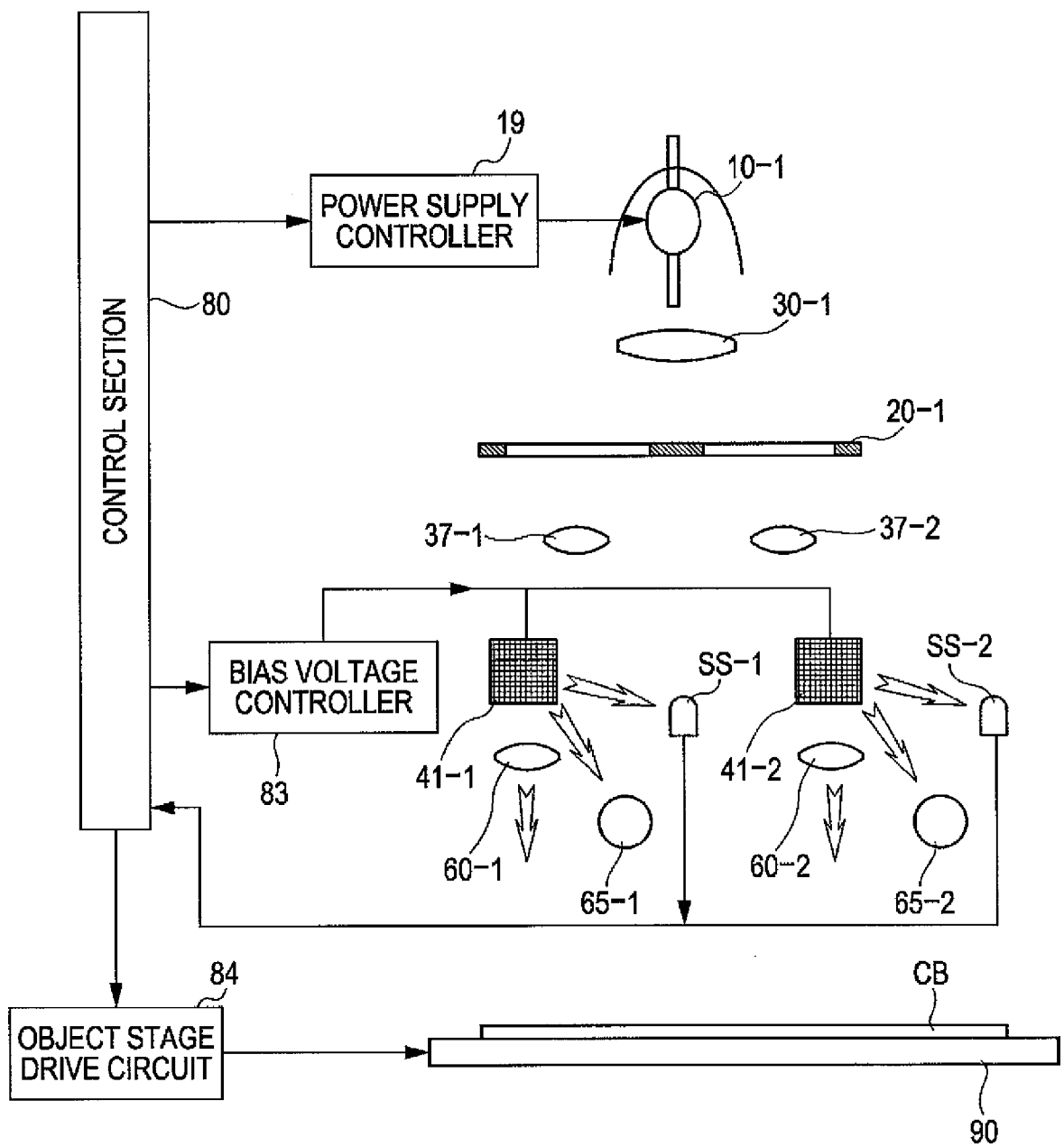
FIG. 7 is a block diagram of the exposure device 100.

The super high-pressure mercury lamp 10-1 is designed to constantly emit a light beam IL while being supplied with electric power from a power supply controller 19 (see FIG. 7). In this way, the intensity of the light beam IL is made stable. A shutter 13-1 is placed at the secondary focal point of the elliptic mirror 11-1 and blocks off the light beam IL when the device 100 does not need to irradiate the object CB.

The first lighting system 30-1 includes a collimator lens 31-1 and a fly-eye lens 32-1, and they shape the light beam IL into a beam of a uniform density. The light beam IL diverges from a point image at the secondary focal point, and is then incident on the collimator lens 31-1. This incident light beam is converted into a collimated beam, and is then inputted to a wavelength selection filter 15-1.

The exposure light IL that has passed through the wavelength selection filter 15-1 is irradiated to the fly eye lens 32-1. The exposure light IL outputted from the fly eye lens 32-1 has a uniform density. Next, the light beam IL enters an aperture member 20-1 provided with four opening windows 21 and a detection window 29 for sensing light intensity. The light beam IL is inputted to the aperture member 20-1 in parallel with the Z axis, that is, perpendicularly to the incident surface of the aperture member 20-1. The light beam IL that has passed through the aperture member 20-1 is split into four beams IL. Finally, the beams IL1 to IL4 are reflected by a reflective optical element 22-1 composed of total reflection mirrors or a prism, and the reflected beams then travel laterally.

Referring to FIG. 1 again, the eight light beams IL (formed by the aperture members 20-1 and 20-2 and the reflective optical elements 22-1 and 22-2) are reflected by a corresponding one of the total reflection mirrors 23-1 to 23-8, and they then travel in parallel with the Y axis. Subsequently, the eight light beams IL are inputted to a corresponding one of the second lighting systems 37-1 and 37-8.

The light beams IL are subjected to beam shaping in the second lighting systems 37-1 to 37-8, so that they each have a predetermined shape and preset intensity. Following this, the light beams IL are thrown to the eight arrayed DMDs 41-1 to 41-8. The DMDs 41-1 to 41-8 spatially modulate the light beams IL based on an input image data. The light beams IL modulated by the DMDs 41-1 to 41-8 pass through the projection optical systems 60-1 and 60-8, respectively, so that each beam has a predetermined magnification. Finally, the light beams IL are irradiated to the object CB.

The exposure device 100 includes a base 95 under the projection optical systems 60-1 to 60-8 with respect to the Z axis, and it supports the first lighting systems 30-1 and 30-2, the second lighting systems 37-1 to 37-8 and the projection optical systems 60-1 and 60-8. The base 95 has a pair of guide rails, and an object table 90 is mounted on the guide rails. This object table 90 is driven by a mechanism (not shown) composed of, for example, a ball screw and a stepping motor. With this mechanism, the object table 90 is moved on the guide rails lengthwise or in parallel with the Y axis relative to the projection optical systems 60-1 to 60-8. On the object table 90, a photoresist-coated substrate is set as the object CB. This object CB is fixed onto the object table 90 by means of negative pressure. The object table 90 can be moved in the X direction, and is further moved in the Z direction so that the light beams IL outputted from the projection optical system 60-1 to 60-8 are focused on the object table 90.

<Arrangement of DMDs>

FIG. 3 shows a cross section of one of the second lighting systems 37-1 to 37-8. In this drawing, a reference numeral 20 indicates an aperture member that represents any one of the aperture members 20-1 and 20-2. Likewise, a reference numeral 23 indicates a total reflection mirror that represents any one of the total reflection mirrors 23-1 to 23-8. A reference numeral 22 indicates a reflective optical element that represents any one of the reflective optical elements 22-1 to 22-2. A reference numeral 37 indicates a second lighting system that represents any one of the second lighting systems 37-1 to 37-8. A reference numeral 39 indicates a mirror that represents any one of mirrors 39-1 to 39-8 (see FIG. 1). A reference numeral 41 indicates a DMD that represents any one of the DMDs 41-1 to 41-8. A reference numeral 43 indicates a reflection prism. A reference numeral 60 indicates a projection optical system that represents any one of the projection optical systems 60-1 to 60-8.

The light beam IL passes through the aperture member 20 and is then reflected by the reflective optical element 22 and the total reflection mirror 23 in this order. Following this, the light beam IL reaches the DMD 41 through the second lighting system 37 that is constituted by an iris adjuster 35 and other optical components such as lenses.

After passing through the second lighting system 37, the light beam IL is reflected by the mirror 39. Subsequently, the reflected light beam IL travels in parallel to the Z axis, and reaches the reflection prism 43. The reflection prism 43 allows the light beam IL to be curved and directed toward the DMD 41 and, then reflects the light beam IL returned from the micro mirrors M of the DMD 41 toward the projection optical system 60.

<DMDs>

Figure 4A:
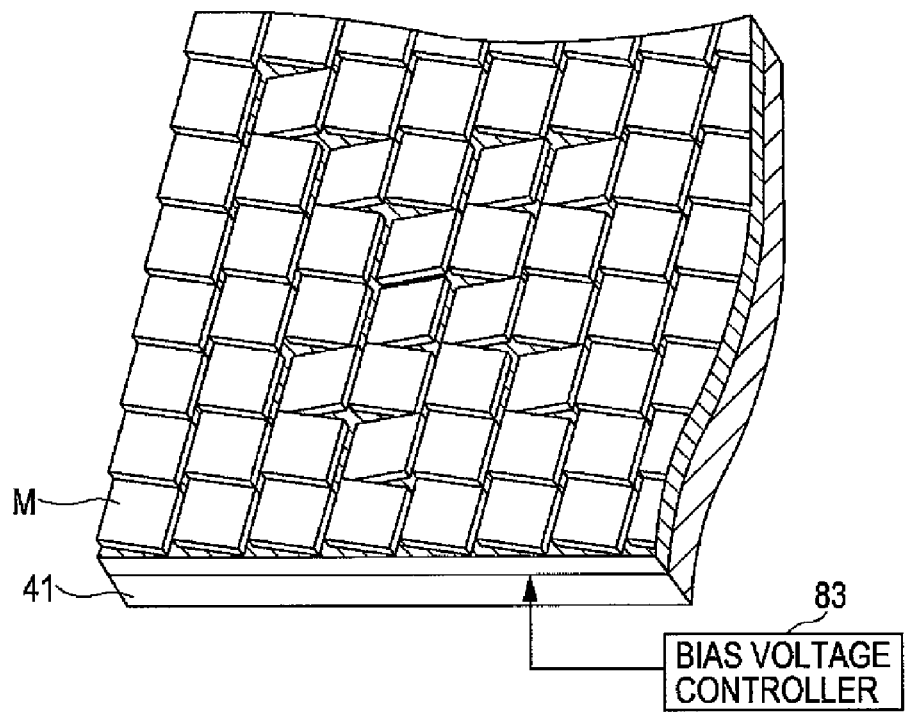
FIG. 4A is a schematic view depicting a DMD 41 of the exposure device 100.
Figure 4B:
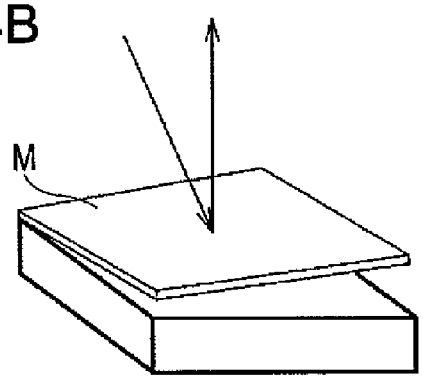
FIG. 4B is a schematic view depicting a micro-mirror M of the DMD 41.
Figure 4C:
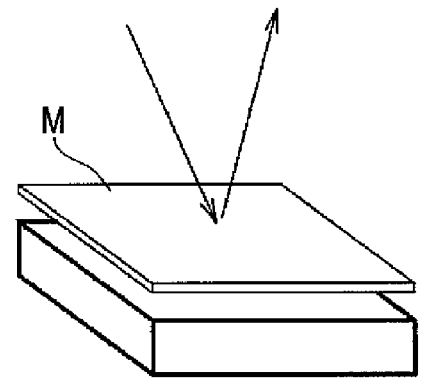
FIG. 4C is a schematic view depicting a micro-mirror M of the DMD 41.
Figure 4D:
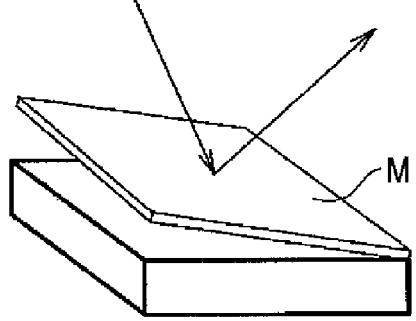
FIG. 4D is a schematic view depicting a micro-mirror M of the DMD 41.

FIG. 4A is a schematic view depicting a part of the DMD 41, FIG. 4B to 4D each show one of micro-mirrors M arranged on a reflection surface of the DMD 41.

In this embodiment, the exposure device 100 has the eight DMDs, and the reflection surface of each of them is composed of, for example, 983040 (768 by 1280) micro mirrors M arranged in a matrix fashion. In the DMD 41, the 768 micro mirrors M are arrayed on the X side and 1280 micro mirrors M are arrayed on the Y side. The reflection surface is about 12 mm long on the X side and about 14 mm long on the Y side. For example, each micro mirror M may have a square shape of 13.68 µm long per side.

The micro mirror M shown in FIG. 4A has a high reflection coefficient and is fabricated by subjecting an aluminum sputtering treatment to a wafer. The DMD 41 swivels the micro mirrors M by means of static electricity. The micro mirror M can be swiveled around the diagonal in response to a bias voltage applied from a bias voltage controller 83. Once the micro mirror M (m, n) ($1 \leq m \leq 768$, $1 \leq n \leq 1280$) is positioned facing the object CB, the light beam IL reflected by the DMD 41 travels toward the projection optical system 60. Otherwise, once the micro mirror M (m, n) does not face the projection optical system 60, the light beam travels to a light absorption plate 65-1 or 65-2 (see FIG. 7), that is, propagates away from the projection optical system 60.

FIG. 4B shows a micro-mirror M of the DMD 41 to which a bias voltage of +24V is applied. In this state, the micro-mirror M is inclined +12° with respect to a horizontal plane of the DMD 41. FIG. 4C shows a micro-mirror M of the DMD 41 to which a bias voltage is not applied. In this state, the micro-mirror M is parallel to the horizontal plane, that is, is inclined 0°. FIG. 4D shows a micro-mirror M of the DMD 41 to which a bias voltage of −24V is applied. In this state, the micro-mirror M is inclined −12°.

Note that inclined angles of the micro-mirror M are not limited to −12°, 0° and +12°.

Referring to JP A 2006-113413 and JP A 2006-343684, the micro-mirrors M are inclined at two angles (+12° and −12°) with respect to the horizontal plane. This is because the orientation of micro-mirrors of the DMD is controlled in a digital form, and an angle "0°" is not considered. In contrast, the bias voltage controller 83 of this embodiment operates the micro-mirrors M in such a way to incline them at three angles (+12°, 0° and −12°) or two angles (0° and +12° or −12°).

The non-biased micro-mirror M, as shown in FIG. 4C, has a less stable angle than that of the biased one. Specifically, the angle of the non-biased micro-mirror M may be varied by about −1° to +1°. Hence, the projection optical system 60 needs to be set such that the exposure light IL reflected from the non-biased micro-mirror M is not inputted to the projection optical system 60. In contrast, the exposure light IL reflected from the biased micro-mirror M (that is inclined at any of +12° and −12°) is required to be inputted to the projection optical system 60.

<Relationship Between Angles of Micro-Mirror M and of Light Beam>

FIGS. 5A to 5C show a relationship between angles of the micro-mirror M and of the light beam.

As shown in FIGS. 5A to 5C, an arrangement of the DMD 41 and of the exposure light beam IL is adjusted in such a way that a main beam contained in the exposure light beam IL forms an angle of +2α° with a normal or vertical line of a horizontal plane.

Referring to FIG. 5A, the micro-mirror M is inclined +α° with respect to the normal line of the horizontal plane. Thus, when the exposure light beam IL is incident on the DMD 41, the main beam in the light beam IL is reflected therefrom in parallel with the normal line of the horizontal plane. This reflected light beam IL is led to the projection optical system 60 and, then forms circuit patterns on the object CB. This configuration is attained while the bias voltage controller 83 (see FIG. 7) is applying a voltage of +24V to the micro-mirrors X of the DMD 41.

Referring to FIG. 5B, the micro-mirror M is inclined 0° with respect to the horizontal plane. Thus, when the exposure light IL is incident on the DMD 41, the main beam in the light beam IL is reflected therefrom at −2α° with respect to the normal line of the horizontal plane. This reflected exposure light beam IL is led to the outside of the projection optical system 60, and travels to, for example, the light absorption plate 65-1 or 65-2 (see FIG. 7). This light absorption plate absorbs the exposure light beam IL in order to prevent its irregular reflection. This configuration is realized while the bias voltage controller 83 is not applying a bias voltage to the micro-mirrors M of the DMD 41.

Referring to FIG. 5C, the micro-mirror M is inclined −α° is with respect to the horizontal surface. Thus, when the exposure light beam IL is incident on the DMD 41, the main beam in the exposure light beam IL is reflected therefrom at −4α° with respect to the normal line of the horizontal plane. This reflected exposure light beam IL is directed to the outside of the projection optical system 60, and travels to, for example, an optical sensor SS1 or SS2 (see FIG. 7). This configuration is made while the bias voltage controller 83 is applying a voltage of −24V to the micro-mirrors M of the DMD 41.

In this way, if an angle at which the exposure light beam IL is incident on the horizontal plane is set to equal to/less than $-2\alpha°$ or equal to/more than $+2\alpha°$, then a luminous flux angle of the exposure light beam IL is $2\alpha°$ or less. Consequently, the respective routes on which the exposure light beams IL of FIGS. 5A, 5B and 5C are reflected from the DMD 41 can be separated from one another.

To give an example, suppose $\alpha=12°$, a luminous flux angle of the exposure light beam IL is 24°.

Note that a spatial light modulator of the present invention is not limited to the DMD 41 of this embodiment. Alternatively, it may be a grating light valve. A grating light valve has a reflection surface composed of fine ribbon-shaped elements. Those elements move vertically with respect to the reflection surface, whereby light reflected from the elements causes the diffraction of the light and directs the light in a desired direction.

<Timing of Forming Patterns>

FIG. 6 is a timing chart of forming patterns. With reference to this drawing, a description will be given, of a timing of forming patterns. The following description is provided on the condition that a (see FIGS. 5A to 5C) is 12°. In FIG. 6, a "pulse A" indicates a bias voltage applied to the DMD 41, a "pulse B" an angle of the micro-mirror M, a "pulse C" a timing of forming patterns DR, and a "pulse D" the irradiation on the optical sensor SS1.

Referring to the pulse A, the bias voltage is increased from 0V to +24V at a time t1. In response to this, the micro-mirror M which has been in an initial horizontal position (referred to as a "second state") starts being inclined (see the pulse B). Then, the micro-mirror M becomes inclined +12° at a time t2 (referred to as a "first state"). After this operation, the patterns DR start being formed (see the pulse C). Note that the patterns are formed on the object when the pulse C is ON, while the patterns are not formed when the pulse C is OFF.

At a time t3, the bias voltage is decreased from +24V to 0V (see the pulse A). Response to this, the micro-mirror M starts returning to the horizontal position, and becomes inclined 0° at a time t4 (see the pulse B) In this state, the exposure light beam IL is not inputted to the projection optical system 60, so that the patterns DR are not formed (see the pulse C). While the micro-mirror M stays inclined 0°, it is preferable that the exposure light beam IL is guided to the light absorption plate 65-1 or 65-2. During a period between the times t2 and t3 over which the micro-mirror M stays inclined +12°, the patterns DR are being formed.

The bias voltage controller 83 varies the bias voltage to 0V to +24V or +24V to 0V. Accordingly, the micro-mirror M performs the same operation during a period between times t5 and t8 as that during the period between the times t1 and t4, although both time lengths are different.

Assume that a transition duration during which the angle of micro-mirror M changes from 0° to +12° is represented by "EC" (see the pulse C). In this case, a transition duration during which the angle of the micro-mirror M changes from –12° to +12° is nearly twice as long as the duration EC (2×EC). Conventionally, the spatial light modulation has been performed while the angle of the micro-mirror M is varied from –12° to +12°. In contrast, in this embodiment, the angle of the micro-mirror M is changed from –12° to 0° or 0° to +12°. Thus, the transition duration of the micro-mirror M in this embodiment can be successfully made shorter. In conventional technique, data for halting the formation of patterns needs to be sent to the DMD in order not to form the patterns. Furthermore, in this case, a typical exposure device is necessary to keep waiting for this data till the time t5.

At a time t9, when the bias voltage changes from 0V to –24V (see the pulse A), the angle of the micro-mirror M which has been in a horizontal position starts being inclined (see the pulse B). Then, the micro-mirror M becomes inclined –12° at a time t10 (referred to as "a third state"). While the micro-mirror N stays inclined –12°, the patterns DR are not formed because the exposure light beam IL is not inputted to the projection optical system 60. Instead, the exposure light beam IL is directed to the optical sensor SS-1 or SS-2 (see a pulse D). Note that the exposure light beam IL is irradiated to the optical sensor when the pulse D is ON, while the beam IL is not irradiated thereto when the pulse D is OFF.

At a time t11, when the bias voltage is changed from –24V to 0V, the micro-mirror M which has been inclined –12° starts returning to the horizontal position as of FIG. 5B. In response to this, the angle of the micro-mirror M becomes 0° at a time t12. During a period between the times t10 and t11 throughout which the micro-mirror M is inclined –12°, the optical sensor is being irradiated the exposure light IL.

Note that the transition duration during which the angle of the micro-mirror M is changed from 0° to –12° is as long as the duration during which it is changed from 0° to +12°.

<Control of Exposure Device>

FIG. 7 is a block diagram of the lighting system and the DMD 41 of the exposure device 100. For the simplification of the following explanation, this drawing shows only the block of a route between the second lighting system 37-1 and the projection optical system 60-1 and of a route between the second lighting system 37-2 and the projection optical system 60-2, although the eight routes are actually used.

A control section 80 is connected to a power supply controller 19, a bias voltage controller 83 and an object stage drive circuit 84. Furthermore, the control section 80 is also connected to the first and second optical sensors SS1 and SS2 that measure the intensity of the exposure light IL. The first optical sensor SS1 measures the intensity of the light reflected from the DMD 41-1, and the second optical sensor SS2 measures the intensity of the light reflected from the DMD 41-2.

The power supply controller 19 adjusts electric power supplied to the super high pressure mercury lamp 10-1. The bias voltage controller 83 drives the 768×1280 matrix-arranged micro-mirrors M of each of the DMDs 41-1 and 41-2, based on the information on circuit patterns supplied from the control section 80. The object stage drive circuit 84 drives the object table 90 at a predetermined speed.

The bias voltage controller 83 applies a bias voltage of +24V to the DMDs 41-1 and 41-2 in order to form circuit patterns. In response to this, the micro-mirrors M of the DMDs are inclined +12°, so that the exposure light beams IL reflected from the DMDs 41-1 and 41-2 pass through the projection optical systems 60-1 and 60-2, respectively.

Meanwhile, when a bias voltage is not applied to the micro-mirrors M, the exposure light beams IL reflected from the micro-mirrors M of the DMDs 41-1 and 41-2 are not directed to the projection optical systems 60-1 and 60-2 but to the light absorption plates 65-1 and 65-2, respectively. Since the exposure light beams IL are absorbed to the light absorption plates 65-1 and 65-2, the randomly reflected exposure light beams IL may not enter the projection optical systems 60-1 and 60-2, respectively.

While the bias voltage controller 83 is applying a bias voltage of –24V to the DMDs 41-1 and 41-2, the matrix-arranged total 983040 micro-mirrors M of each DMD are inclined –12°. In this case, the whole exposure light beams IL reflected from the DMDs 41-1 and 41-2 are directed to the optical sensors SS1 and SS2, respectively. The control section 80 memorizes the intensity of the light as a reference light intensity beforehand, when all 983040 micro-mirrors M are inclined −12°. If one or more micro-mirrors M of the DMD are damaged, then the intensity of the reflected light is different from that of the reference light. This is how, the control section 80 can diagnose the operation condition of the DMDs.

Every time the lots of objects CB are changed, the light intensities of the super high pressure mercury lamps is preferably monitored on the condition that all the 983040 micro-mirrors M are inclined −12°.

In general, the DMDs need to be exchanged regularly. When there seems to be any abnormality on the route between the aperture member and the projection optical system, if the difference of the light intensities exceeds a predetermined value, the control section 80 may alarm the abnormality or the dead of the DMDs.

In this embodiment, the spatial light modulator is implemented by a DMD which can be oriented at +12° and −12°, but the angles of the micro-mirrors are not limited to +12° and −12°. Those angles may be determined appropriately based on the angles of the incident light and reflected light.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. An exposure device for forming circuit patterns onto a surface of an object, comprising:
   at least one spatial light modulator including a plurality of reflection elements being arranged in a matrix fashion;
   at least one optical source supplying exposure light to the reflection elements; and
   a bias voltage controller applying a bias voltage to the reflection elements;
   a control section monitoring an intensity of the exposure light;
   wherein when the bias voltage is a first voltage, the reflection elements are set to a first state in which the exposure light is delivered to the surface of the object;
   wherein when the bias voltage is not supplied, the reflection elements are set to a second state in which the exposure light is not delivered to the surface of the object and is not measured by the control section; and
   wherein when the bias voltage is a third voltage, the reflection elements are set to a third state in which the exposure light is not delivered to the surface of the object and is measured by the control section.

2. The exposure device according to claim 1, wherein if the reflection elements in the first state form an angle of α° with those in the second state, then the exposure light that is incident on and reflected from the reflection elements has a luminous flux angle of 2α° or less.

3. The exposure device according to claim 1, wherein the control section is further provided for monitoring an operation of the spatial light modulator in the second or third states.

4. The exposure device according to claim 2, wherein the control section is further provided for monitoring an operation of the spatial light modulator in the second or third states.

5. The exposure device according to claim 1, wherein the second state and the third state are different from each other in an angle of the reflection elements.

6. The exposure device according to claim 1, wherein the optical source comprises at least one of a super high pressure mercury lamp, a xenon lamp, a flash lamp and an LED.

7. The exposure device according to claim 2, wherein the optical source comprises at least one of a super high pressure mercury lamp, a xenon lamp, a flash lamp and an LED.

8. The exposure device according to claim 1, wherein the circuit patterns are formed onto the surface of the object when the reflection elements are switched to the first state.

9. The exposure device according to claim 8, wherein the circuit patterns are not formed onto the surface of the object when the reflection elements are switched to the second state.

* * * * *